United States Patent [19]

Giamei

[11] Patent Number: 4,469,160
[45] Date of Patent: Sep. 4, 1984

[54] SINGLE CRYSTAL SOLIDIFICATION USING MULTIPLE SEEDS

[75] Inventor: Anthony F. Giamei, Middletown, Conn.

[73] Assignee: United Technologies Corporation, Hartford, Conn.

[21] Appl. No.: 333,600

[22] Filed: Dec. 23, 1981

[51] Int. Cl.³ .................... B22D 27/04; B22D 15/00
[52] U.S. Cl. ................................ 164/122.1; 164/127
[58] Field of Search ............... 164/122.1, 122.2, 125, 164/127

[56] References Cited

U.S. PATENT DOCUMENTS 2,694,024 11/1954 Bond et al. .
2,791,813 5/1957 Delano .
3,260,505 7/1966 Snyder ........................ 164/122.1
3,598,169 8/1971 Copley et al. .
3,857,436 12/1974 Petrov et al. .

Primary Examiner—Nicholas P. Godici
Assistant Examiner—Jerold L. Johnson
Attorney, Agent, or Firm—C. G. Nessler

[57] ABSTRACT

Disclosed is a method for directional solidification of large single crystal metal alloy castings using multiple seed crystals. Solidification interfaces emanate from the separate seeds, and merge to form a unitary solidification interface which is caused to move through the article. The crystallographic orientation of the seeds is controlled, to avoid unacceptable mismatch of crystal structure orientation where the separate interfaces merge.

4 Claims, 8 Drawing Figures

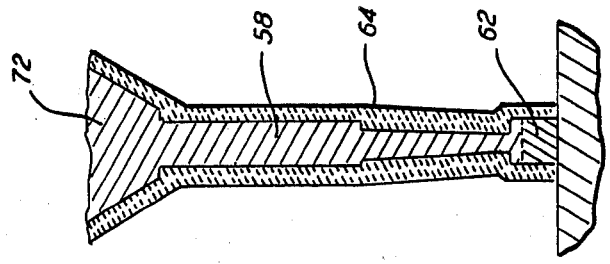
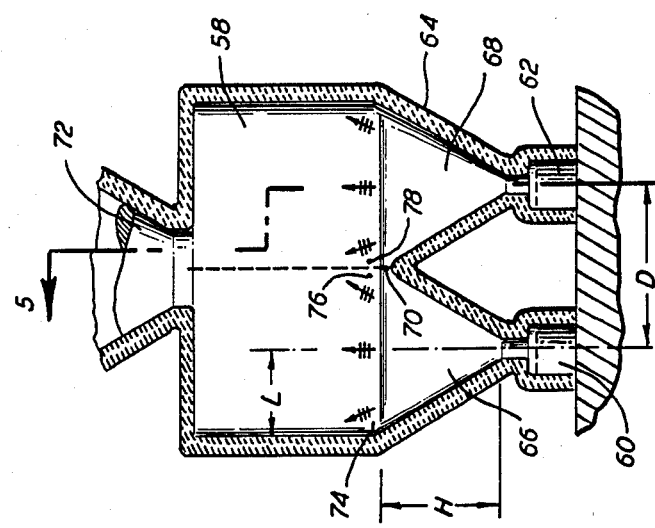
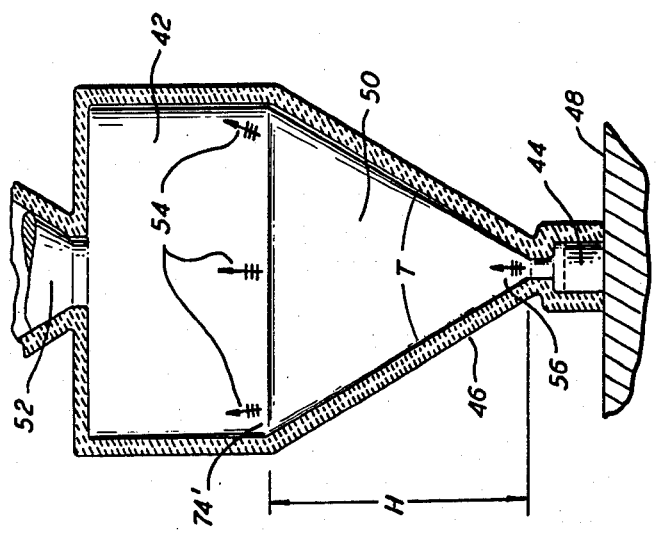

SINGLE CRYSTAL SOLIDIFICATION USING MULTIPLE SEEDS

DESCRIPTION

1. Technical Field

The present invention relates to the field of casting, more particularly to the directional solidification of single crystal structures.

2. Background Art

Directional solidification is a method of casting using controlled cooling to cause a solidification interface to move progressively through a mold filled with molten metal. In the highest technology embodiment of this process, single crystal articles are cast. Piearcey in U.S. Pat. No. 3,494,709 discloses single crystal metallic parts and their method of making. There have been numerous subsequent patents which disclose improvements in the casting process. In a solidification of face centered cubic crystal structure metal alloys, such as superalloys in common use in gas turbine engines, a part solidified in accord with the teachings of Piearcey will have a primary crystal orientaton of [001] and a random secondary orientation. The primary orientation is the crystal orientation which lies along the axis along which the solidification interface moves; typically, this is the z axis of the part. The secondary orientation is the crystal orientation, with respect to a reference axis, which lies, e.g., in the x-y plane.

Whenever there is desired an orientation different from that which the natural growth of the Piearcey type process provides, seeding must be used. In seeding, a previously made single crystal is placed at the bottom of the mold. Molten metal contacts and partially melts the seed. When the melt is progressively cooled, the crystal growth is epitaxial from the seed. Seeding has been used in instances both where orientation is to be controlled, and where it is simply a convenient technique for forming a single crystal.

When a single crystal structure is initiated in molten metal, it is caused to propagate through the molten casting by progressively moving a thermal gradient through a part. Often, the crystal growth must take place transverse to the direction in which the primary thermal gradient is moved. This is the situation, for example, when the part has a body with an overhanging flange. The crystal must grow laterally while the gradient continues to move along the primary axis of the part. In a related co-pending application, U.S. Ser. No. 330,911, having common assignee herewith, Anderson et al. disclose a method for casting components with large overhanging flanges, which comprises moving the solidification front through the part in a direction transverse to that normally associated with such parts.

However, the Anderson et al. invention does not solve the problem presented by parts which simply have very large widths in their body. Large single crystal seeds are avoided in epitaxial directional solidification because they are costly to prepare. Practically speaking, this means that relatively long outwardly tapered transition sections must be utilized, to grow from a small seed to a large transverse section. This is because the driving force for solidification is in fact the thermal gradient, and lateral crystal growth is only significantly accomplished when there is growth simultaneously along the axis of the thermal gradient.

Long transition sections present problems because the vertical height of a mold necessary to make a relatively wide part becomes unacceptably increased. Another problem arises when there is substantial lateral crystal growth. In many large castings, it has now been discovered, there are significant deviations from the uniformity of crystal structure that constitutes the essence of single crystal castings, as detailed further hereinafter. If the variation in crystal alignment is kept within certain limits, it is tolerable. But in large castings grown in the conventional mode from a single small seed crystal this is oftentimes not achievable.

A different approach to making a large single crystal part is disclosed in U.S. Pat. No. 3,967,355 to Giamei et al. having common assignee herewith. Single crystal pieces are formed separately and diffusion bonded together, to form a unitary part. However, this is only accomplished when the respective parts have matching crystallographic orientations. While the foregoing process is effective, the process of diffusion bonding involves an additional cost which it is desirable to avoid.

Thus, there is a need for an improved method of making a part having a relatively large cross section measured in the plane transverse to the solidification direction.

DISCLOSURE OF INVENTION

An object of the invention is to make single crystal articles which have relatively large lateral dimensions, while using relatively small diameter seeds.

According to the invention at least two seeds are provided with a mold containing molten metal. Directional solidification is carried out so that separate solidification interfaces move simultaneously through the molten metal, emanate from each seed, and the interfaces merge thereafter into a unitary solidification interface. The unitary interface is then caused to move through the molten metal in the mold, to form the article. A single crystal article made in conformance with the foregoing method will be one which substantially has properties associated with an ideal single crystal article. That is, articles made according to the prior art, and according to the techniques of the present invention, will have within them variations in crystal structure. In an article made according to the present invention, there will be a mismatch in orientation where the separate solidification interfaces merge. So long as the mismatch is less than a critical value at which mechanical properties may sharply decrease, the article and the method of making it will be useful.

In the method of the present invention, the adjacant seeds must be crystallographically oriented with respect to one another within angular limits which are a function of the crystallographic mismatch capability of the metal, and the distance between the seeds and the point at which the solidification interfaces from the seeds merge within the casting. In a representative nickel superalloy, the crystallographic orientations of adjacent seeds are made to correspond within less than 6°, preferably within less than 2°.

When multiple seeds are used, the height of the transition region between the seed and the article is reduced, and it is possible to make larger castings within any given apparatus. Further, the crystallographic variations, within a large article are reduced when the multiple seeds are used.

The foregoing and other objects, features and advantages of the present invention will become more apparent from the following description of preferred embodiments and accompanying drawings.

BRIEF DESCRIPTION OF DRAWINGS

FIG. 3 illustrates how a relatively large flat plate is directionally solidified from a seed using the prior art techniques.

FIG. 4 illustrates how a relatively large flat plate is directionally solidified using two seeds, in accord with the invention.

FIG. 5 is a cross section of the casting and ceramic mold shown in FIG. 4.

BEST MODE FOR IMPLEMENTING THE INVENTION

The invention is described in terms of the casting in a ceramic mold of a large flat plate made of a single crystal face centered cubic superalloy such as described in U.S. Pat. No. 4,209,348 to Duhl et al., but it will be understood that the invention is applicable to other configurations and to the casting of other metals. The making of a single crystal part by directional solidification of molten metal is described in U.S. Pat. No. 3,494,709 and U.S. Pat. No. 3,542,120 to Piearcey, No. 3,700,023 to Giamei et al., and No. 4,190,094 to Giamei, the disclosures of which are hereby incorporated by reference.

As reference to the foregoing patents and the general prior art will indicate, the directional solidification of a metal casting is accomplished by pouring molten metal into a ceramic mold, and then causing a solidification interface, or front, to move progressively through the molten metal, typically from the bottom of the mold to the top of the mold. The solidification interface is defined as lying at the mean location between the liquidus and solidus front within the molten metal. Generally, solidification takes place by the growth of primary dendrites, perpendicular to the solidification interface. The present invention is concerned with solidification which is epitaxial with the crystal structure of a seed crystal. Many subtle phenomena take place during epitaxial solidification and the microdynamics of the process are not fully understood. Therefore, the explanations provided herein should be considered as being based in some measure on inference and speculation. They are provided in order to enable a phenomenological understanding of the problem which the invention solves.

Figures 1, 2:
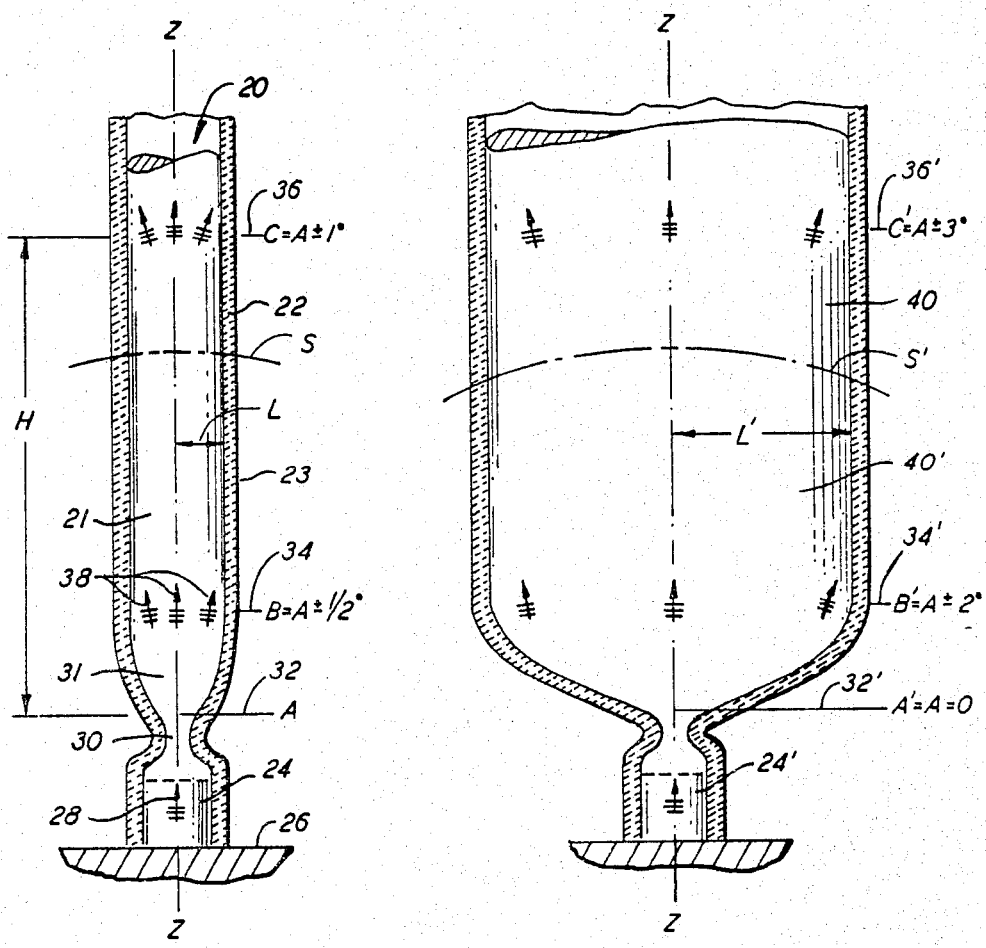
FIG. 1 shows a single crystal metal casting after it has been solidified from a seed within the ceramic mold, which is shown partially cut away.
FIG. 2 is similar to FIG. 1, but shows a larger diameter casting.

FIG. 1 shows in partial cross section a casting 20 as it would appear upon solidification in a ceramic mold 22. At the base of the mold is a seed crystal 24, which rests on a cold chill plate 26. This seed has an ideal crystal orientation, indicated by the symbol 28; the crystal is aligned with the z axis of the part. After molten metal is introduced into the mold, and a partial melting of the seed is caused, a thermal gradient is caused to move progressively along the z axis of the part. The motion of the thermal gradient causes the movement of a solidification interface through the casting. While it is generally an object to make the solidification interface planar and normal to the z axis, such perfection is not often achieved. The shape of the solidification interface will vary with the rate of solidification, the manner in which the heat is lost from the solidified casting, and the shape of the casting. (To simply describe the present invention, the effects of change in shape of a casting will be ignored. U.S. Pat. No. 4,190,094 may be referred to for an understanding of such effects.)

FIG. 1 shows by the curved line S the typical shape of the solidification interface when it is caused to move through the uniform cross section article part 21 of the casting. Because heat loss tends to be from the exterior surface 23 of the mold, there is a thermal gradient from the center of the casting to its outer surface. The curved interface means that the primary dendrites on one side of the casting will be inclined with respect to the dendrites on the opposing side of the casting, since dendrites tend to grow normal to the solidification interface. As indicated, the seed crystal 24 was taken as having perfect and uniform alignment. Immediately above the seed crystal is a restriction 30 in the mold cavity which insures that only metal epitaxial with the center of the seed will grow into the transition section part 31 of the casting 20. Its primary purpose is to avoid any extraneous grain growth, such as may emanate from the periphery of the seed.

Three lateral planes 32, 34 and 36 are indicated along the length of the casting, as reference locations for describing the change in crystal microstructure in the casting. The letters A, B and C indicate the crystal orientation at the foregoing planes. In summary, it is found that the crystallographic orientation at plane 36, near the top of the casting, is variant from that at the lower parts of the casting. The crystal structure at the base of the casting, at plane 32, is designated as A, and is essentially that in the seed 28. The article and transition parts of the casting have a length H of about 13 cm, and plane 34 is about 2 cm above plane A. The article is a round bar with a radius or lateral half width L of about 0.6 cm. The crystal orientation B at plane 34 is found to be essentially that found at plane A, but it is found that there is greater variation across the lateral plane of the casting. This is indicated by the arrows 38, which show in exaggerated fashion the divergence of the crystal orientation. As indicated in the figure, B has ± one-half degree variation from the A orientation. Near the top of the casting, at plane 36, the crystal orientation C is characterized by a mean value still essentially that of A, but with a variance of ±1°. The precise physics behind the observed increasing variation in crystal structure along the length of the casting are not fully understood. As indicated, the curvature of the solidification interface probably has some influence. However, in the example, the curvature does not substantially vary along the length of the casting. Nonetheless, there is a progressive degeneration in crystal structure along the length of the casting, probably reflective of small changes in interface shape or velocity.

The significance of the progressive crystallographic deterioration is that the mechanical properties of a single crystal superalloy are dependent on crystallographic orientation. When the variation in crystal structure becomes too great, the desired properties will not be obtained throughout the casting.

The degeneration in crystal structure is not only a function of the height H of the casting, but it is a function of the width of the casting as well. This is illustrated by FIG. 2, where the casting has a radius L' of about 2.5 cm compared to L of about 0.6 cm for the casting of FIG. 1. Referring to FIG. 2, it is seen that the solidification interface S' is more curved, because of the greater volume to surface area ratio of the casting, and resultant changed heat transfer. The planes 32', 34' and 36' correspond with their analogs in FIG. 1. At plane 32' it is seen that the crystal orientation A' is equal to the orientation A of the casting of FIG. 1, when seed 24' is identical to seed 24. However, at plane 34' it is seen that the crystal structure B' has a variation of ±2°, compared to ±1/2° in the smaller casting. At plane 36' it is seen that the crystal orientation C' varies by ±3°. The foregoing variations are typical, and the exact values may vary from one casting to the next. But, they serve to illustrate that when there is greater lateral growth of the crystal, there will be greater angular misorientation. As the Figures show, the crystal must grow laterally from the z axis center line, a distance L or L' to the outer edge 40, 40' of the castings.

FIG. 3 shows a rectangular plate casting 42 which is cast in accord with the techniques of the prior art. A single seed 44 is at the base of the mold 46 which rests on a chill plate 48. Connecting the seed with the article is a transition section 50; this section characteristically has a 120° included angle T. Greater angles are possible but tend to create crystal defects in addition to those described here. See the afore-mentioned Anderson et al. application Ser. No. 330,911 for further discussion of the angle of the transition section. At the top of the mold is a riser section 52, where molten metal is first introduced and supplied to the solidifying and shrinking casting. As will be appreciated from the foregoing discussion, the crystal structure near the bottom of the article part of the casting, indicated by the symbols 54, will be not uniform, compared to the crystal structure at the point 56 just above the seed.

FIGS. 4 and 5 illustrate the practice of the invention, in making of a plate 58 which has the same dimensions as the plate 42 shown in FIG. 3. Two seeds 60, 62 are provided at the base of the mold 64. Transition sections 66, 68 enable a solidification interface to move from the seed crystals toward the article part 58. In the preferred practice of the invention, the solidification interfaces meet at the intersection point 70 within the mold, just before the solidification interface moves into the article cavity of the mold. Thereafter, the solidification interface moves progressively through the cavity defining the article 58, and finally up into the riser 72, whereupon the casting has been completed. Referring to the representative seed 60, it will be seen that crystal growth took place along a vertical distance H and a lateral distance L, to reach the corner 74 of the article. In comparison, it is seen that the corresponding distances to reach the analagous point 74' in the article of FIG. 3 are twice as great. Thus, the crystal structure at point 74 in the article of FIG. 4 will be characterized by less variation than the crystal structure at point 74' in the article of FIG. 3. The vertical height of the article 58 is similar to that of the article 42. Consequently, the further degeneration crystal structure in each article, to its top, will be about the same for each. But, because of the better conditions at the base where the transition section connected, the net result is that the article made by the practice of FIG. 4 has less total variation, expressed as a range, than the article of FIG. 3. It is therefore more nearly perfect, and it will be appreciated that the method permits larger castings to be made before the limiting crystal degeneration is reached.

Looking at FIG. 4, it will be evident that there will be angular mismatch in orientation of the crystal growth 76 which emanates from the seed 60 and the adjacent crystal growth 78 which emanates from the seed 62. This mismatch will propagate through the casting along an intersection plane represented by the line 70. The degree of initial mismatch will depend on the z axis distance (approximately equal to H in the Figure) and the spacing D between the adjacent seeds. There is a permissable mismatch in crystallographic orientation, where two solidification interfaces merge. Basically, the permissable limit is determined by measuring the mechanical properties of a test casting, to ascertain if they are substantially preserved across the mismatch interface, or grain boundary.

Figure 6:
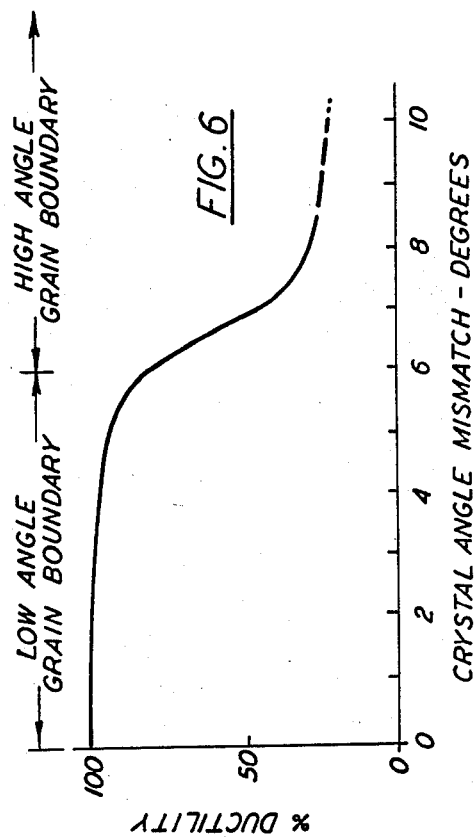
FIG. 6 shows the effect on tensile elongation of different degrees of crystallographic mismatch at a grain boundary within a single crystal casting.

It may seem somewhat of a contradiction in terms to describe an article as a single crystal and at the same time characterize it as having varying crystal orientation or an internal grain boundary. However, it is only the imperfection of language at this present state of technology which leads to apparent contradiction. Functionally, in the view of those having skill with single crystals, and for the purposes of the present invention, an article is a single crystal if it mechanically behaves substantially similarly to an article with minimal crystallographic variation. Thus, it will be understood that the term "single crystal" when used in reference to a directionally solidified casting must be appreciated as a term of art and not as a precise scientific characterization. With respect to the mismatch which is tolerable when two slightly different orientation interfaces merge, FIG. 6 shows what happens to the tensile elongation in a representative nickel alloy pulled transverse to a grain boundary, when two abutting parts of the casting vary crystallographically by differing amounts. When the mismatch is less than about 6°, the properties are substantially unchanged from a "perfect" (0°) single crystal. However, above 6° the ductility falls sharply, to a value less than about 50% of the 0–6° range properties. Grain boundaries in single crystal superalloys are not like grain boundaries of traditional polycrystal superalloys, where there are many precipitates. Technically speaking, any interface where there is a change in crystal orientation can be characterized as a grain boundary. However, it is recognized that there are variations in crystal orientation within a part which is still functionally a single crystal. For example, in the prior art, the characterization of "sub-boundary" has been used where the orientation angle mismatch is low, e.g., less than about 1°. For purposes of the present invention, 6° is a critical mismatch angle value in a representative alloy. Thus, I characterize articles having grain boundaries with less than the critical mismatch angle value as comprising low angle mismatch grain boundaries, and those exceeding the value as comprising high angle mismatch grain boundaries.

As should be now appreciated, there are two critical aspects to the crystallographic variation in a casting of the invention. First, there is the variation within a casting, formed from a single solidification front, due to lateral growth and due to longitudinal growth. Secondly, there is the grain boundary mismatch where two solidification interfaces merge. In the practice of the invention for forming a particular cast article, the first variation is being reduced while the second is being countenanced. But inasmuch as the range of variation is being reduced, the invention is advantageous.

To succeed in the practice of the invention, the orientation of the adjacent seeds with respect to each other must at least be less than the permissable limit of mismatch where the solidification interfaces join, e.g., 6° for the alloy mentioned above. The farther apart the separate seed-derived solidification interfaces are from each other initially (that is, the greater the distance D and the height H in FIG. 4), the closer must be the crystallographic orientations of the seeds. In practice, the seeds themselves may not be perfect single crystals in the context of the phenomena described herein. And there are practical limits to the degree which adjacent crystals can be aligned in a commercial production setting. Therefore, in the practice of the invention it is preferred that the adjacent seed crystals be aligned within less than 2° of each other.

Of course, after solidification, the riser and transition section are removed from the desired article part of the casting. Thus, certain articles (such as shown in FIG. 4) made in accord with the invention will be characterized by a low angle mismatch grain boundary at which there are two abutting crystal microstructures with orientations inclined toward, or intersecting, each other. And there will be corresponding regions further removed from each side of the grain boundary, where the crystal orientations are comparatively less inclined toward each other.

Figure 7:
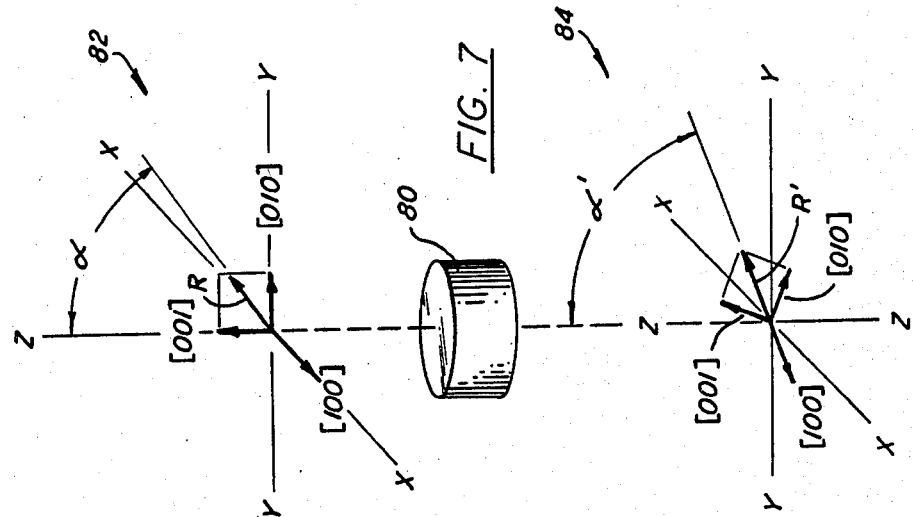
FIG. 7 illustrates how one crystallographic orientation can be compared to another, with respect to a single reference angle.

The angular orientation of crystals, and the degree of mismatch referred to herein, can be determined by conventional means such as the LawÉ method of X-ray diffraction. Those familiar with crystallography will appreciate how to compare the orientation of different crystals. Principally, this would be according to the general principles, such as stereographic projection described in the text by Barrett and Massalski, *Structure of Metals*, 3rd ed., (1966) McGraw-Hill, New York, USA. As a simplified illustration of what is meant by crystallographic orientation and mismatch, reference may be made to FIG. 7. Shown therein is a representative seed crystal 80 having x, y and z axes. The representation 82 above the seed shows how face centered cubic axes might be aligned perfectly with the x, y, and z axes. The representation 84 below the seed shows how the crystal axes might be misaligned with respect to the x, y and z axes. A simple reference vector R, R' shown in both representations, can be used. R, R' are the resolved vectors between the [001] and [010] axes. And since any two vectors form an orthonormal basis for defining all crystal directions in a cubic crystal system, the vectors R, R' will define the crystal orientation. Thus, in the two representations in FIG. 7, the angular difference between the vectors will be descriptive of the difference in crystal orientation, i.e., the mismatch angle.

Figure 8:
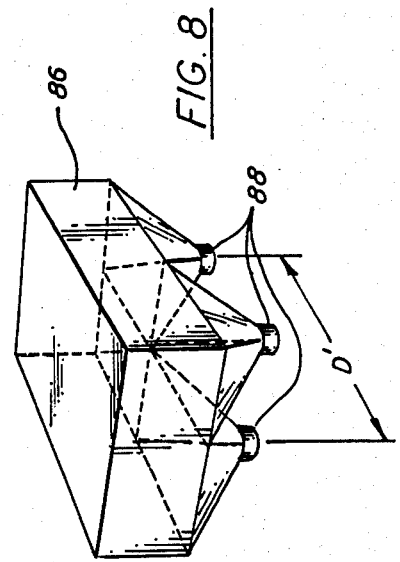
FIG. 8 shows an embodiment of the invention where four seeds are used to make a large casting.

The principles of the invention may be applied to other embodiments. For example, more than two seeds may be used, as an extension of the principles illustrated by the foregoing description. In addition, large rectangaloid objects may be solidified from multiple seeds as illustrated by FIG. 8 which shows a large block 86 made using four seeds 88. For the configuration shown in FIG. 8, the critical dimension at which the interfaces must meet the mismatch criterion is a function of D', the furthest distance at which the seeds are spaced apart.

Although this invention has been shown and described with respect to a preferred embodiment, it will be understood by those skilled in the art that various changes in form and detail thereof may be made without departing from the spirit and scope of the claimed invention.

I claim:

1. The method of directionally solidifying a single crystal structure cast part from molten metal contained in a mold, comprised of providing at least two seeds within the mold; causing separate solidification interfaces to move from each seed simultaneously through the molten metal, so that the solidification interfaces from adjacent seeds merge to form a unitary solidification interface; and, causing the unitary solidification interface to move through the remainder of the molten metal in the mold, wherein adjacent seeds are crystallographically oriented with respect to one another within an angular limit which is less than the critical crystallographic mismatch angle for the metal, wherein the critical crystallographic mismatch angle is the angle beyond which the tensile ductility in a casting transverse to the direction in which the interfaces were caused to move is reduced to less than 50% of the same property in a casting with zero mismatch angle.

2. The method of claim 1 wherein the metal is a superalloy and the crystallographic orientations of the seeds are made to correspond within less than six degrees.

3. The method of claim 2 wherein the orientations correspond within less than two degrees.

4. An article formed by the method of claims 1 or 2 characterized by a low angle grain boundary at the intersection of two adjacent crystal structures, the crystal structure orientation of the part of the article on one side of the boundary being inclined in a direction opposing the crystal structure orientation of the part of the article on the other side of the boundary.

* * * * *